(12) United States Patent
Kuan et al.

(10) Patent No.: US 10,056,455 B1
(45) Date of Patent: Aug. 21, 2018

(54) SEMICONDUCTOR DEVICE AND METHOD OF FABRICATING THE SAME

(71) Applicant: Taiwan Semiconductor Manufacturing Co., Ltd., Hsinchu (TW)

(72) Inventors: Ting-Chun Kuan, Taichung (TW); I-Chih Chen, Tainan (TW); Chih-Mu Huang, Tainan (TW); Ching-Pin Lin, Hsinchu County (TW); Fu-Tsun Tsai, Tainan (TW); Ru-Shang Hsiao, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/800,097

(22) Filed: Nov. 1, 2017

(51) Int. Cl.
| | |
|---|---|
| *H01L 29/06* | (2006.01) |
| *H01L 29/08* | (2006.01) |
| *H01L 27/088* | (2006.01) |
| *H01L 21/02* | (2006.01) |
| *H01L 23/532* | (2006.01) |
| *H01L 29/10* | (2006.01) |
| *H01L 29/423* | (2006.01) |

(52) U.S. Cl.
CPC ...... *H01L 29/0843* (2013.01); *H01L 21/0243* (2013.01); *H01L 21/02107* (2013.01); *H01L 23/53295* (2013.01); *H01L 27/088* (2013.01); *H01L 27/0883* (2013.01); *H01L 29/0642* (2013.01); *H01L 29/0649* (2013.01); *H01L 29/0653* (2013.01); *H01L 29/0847* (2013.01); *H01L 29/1079* (2013.01); *H01L 29/1083* (2013.01); *H01L 29/4232* (2013.01); *H01L 29/42312* (2013.01); *H01L 29/42316* (2013.01)

(58) Field of Classification Search
None
See application file for complete search history.

(56) References Cited

U.S. PATENT DOCUMENTS

| | | | | |
|---|---|---|---|---|
| 9,287,398 | B2 * | 3/2016 | Kwok | H01L 29/7848 |
| 9,293,534 | B2 * | 3/2016 | Tsai | H01L 29/0847 |
| 9,812,569 | B2 * | 11/2017 | Chen | H01L 29/7848 |
| 9,812,570 | B2 * | 11/2017 | Chen | H01L 29/7848 |
| 2014/0264440 | A1 * | 9/2014 | Chen | H01L 29/66636 257/190 |

* cited by examiner

*Primary Examiner* — Minh-Loan Tran
(74) *Attorney, Agent, or Firm* — JCIPRNET

(57) ABSTRACT

A semiconductor device including a substrate, a gate stack, a pair of insulator structures, and source/drain materials is provided. The substrate has a plurality of recesses, wherein the plurality of recesses defines a protruded portion of the substrate having a channel region, and the protruded portion has a first side surface and a second side surface opposite to the first side surface. The gate stack is disposed on the protruded portion of the substrate. The pair of insulator structures are disposed within the plurality of recesses and respectively covering parts of the first side surface and the second side surface of the protruded portion, wherein the channel region is uncovered by the pair of insulator structures. The source/drain materials are disposed on the substrate in the plurality of recesses and on two opposing sides of the channel region, wherein the source/drain materials cover the pair of insulator structures.

20 Claims, 5 Drawing Sheets

SEMICONDUCTOR DEVICE AND METHOD OF FABRICATING THE SAME

BACKGROUND

The semiconductor integrated circuit (IC) industry has experienced rapid growth. Over the course of this growth, functional density of the devices has generally increased by the device feature size. This scaling down process generally provides benefits by increasing production efficiency, lower costs, and/or improving performance. Such scaling down has also increased the complexities of processing and manufacturing ICs and, for these advances to be realized similar developments in IC fabrication are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
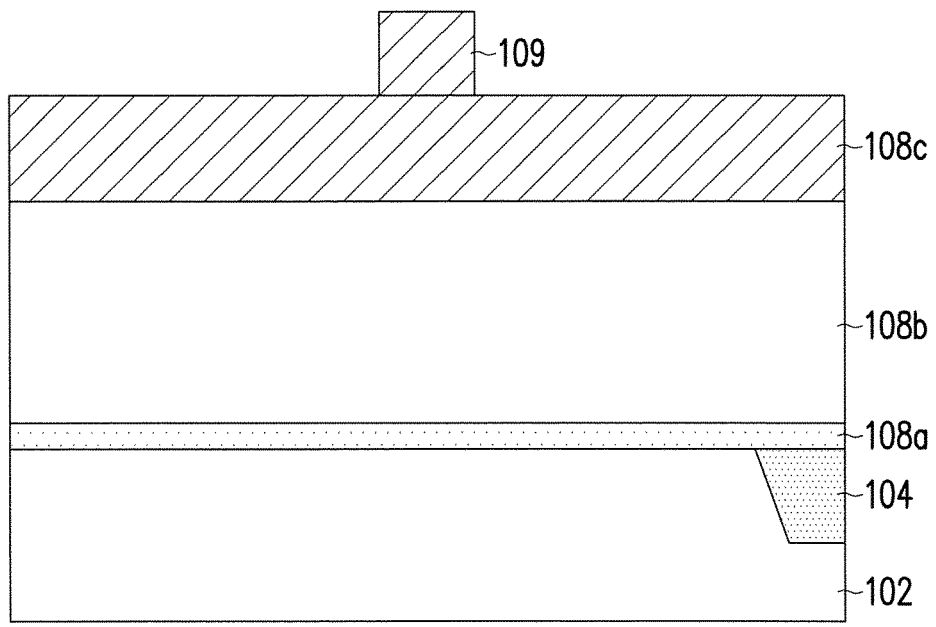
FIG. 1 to FIG. 8 are schematic views illustrating various stages of a method of fabricating a semiconductor device according to some embodiments of the present disclosure.
Figure 2:
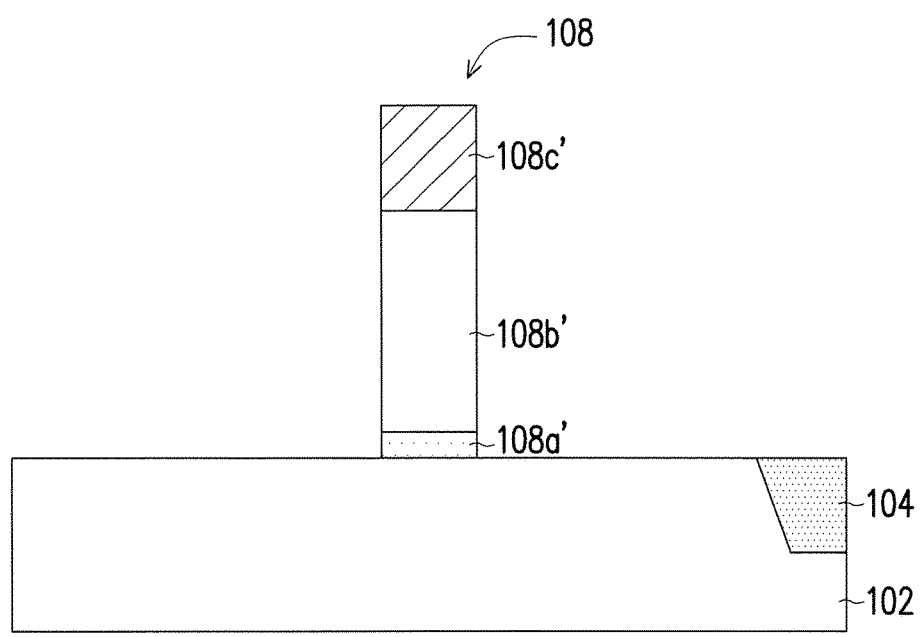

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 8 are schematic views illustrating various stages of a method of fabricating a semiconductor device according to some embodiments of the present disclosure. Referring to FIG. 1, a substrate 102 is provided, and a gate dielectric layer 108a, a gate layer 108b, a hard mask layer 108c are sequentially formed (from bottom to top) on the substrate 102. The substrate 102 is for example, a planar substrate or a bulk substrate. In some embodiments, a material of the substrate 102 includes silicon, an alloy semiconductor such as silicon germanium, silicon germanium carbide, gallium arsenic phosphide, or gallium indium phosphide, or other semiconductor materials. In addition, the substrate 102 may be a semiconductor on insulator such as silicon on insulator (SOI) or silicon on sapphire. Alternatively, the substrate 102 includes other elementary semiconductor materials such as germanium, gallium arsenic, or other suitable semiconductor materials. In some embodiments, the substrate 102 further includes other features such as various doped regions, a buried layer, and/or an epitaxy layer. For instances, the substrate 102 may include various doped regions depending on design requirements (e.g., p-type wells or n-type wells). The doped regions are doped with p-type dopants, such as boron or $BF_2$, and/or n-type dopants, such as phosphorus or arsenic. Moreover, the doped regions may be formed directly on the substrate 102, in a P-well structure, in an N-well structure, in a dual-well structure, or using a raised structure. Moreover, the substrate 102 may also include trench isolation structures 104, which are formed to isolate the active region of the semiconductor device. The trench isolation structures 104 utilize isolation technology, such as local oxidation of silicon (LOCOS) or shallow trench isolation (STI) to electrically isolate various regions. If the trench isolation structures 104 are made of STIs, the STI region comprises silicon oxide, silicon nitride, silicon oxynitride, other suitable materials, or a combination thereof.

In the exemplary embodiment, the gate dielectric layer 108a may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In one embodiment, the gate dielectric layer 108a may be formed by a suitable process such as atomic layer deposition (ALD), chemical vapor deposition (CVD), physical vapor deposition (PVD), thermal oxidation or UV-ozone oxidation. In some embodiments, the gate layer 108b may be any suitable conventional material used in semiconductor fabrication processes for transistor gates. For example, in some embodiments, the gate layer 108b may be a doped or undoped polysilicon layer, metal-containing layer, combinations thereof, or other conductive layer that is able to serve as a transistor gate for controlling the flow of electrons between the source and drain of a semiconductor device. In some embodiments, the hard mask layer 108c may include silicon nitride (SiN), silicon carbide (SiC), silicon oxynitride (SiON) or other suitable materials that protects the gate layer 108b during various etching and material removal steps.

After forming the gate dielectric layer 108a, the gate layer 108b and the hard mask layer 108c, a patterned photoresist 109 is formed directly on the hard mask layer 108c. The patterned photoresist 109 may be patterned using conventional photolithography techniques, and is configured and shaped to provide a pattern of the gate electrode formed in subsequent steps. For example, referring to FIG. 2, portions of the gate dielectric layer 108a, the gate layer 108b and the hard mask layer 108c not covered by the patterned photoresist 109 are sequentially etched to form a gate stack 108. In some embodiments, anisotropic etching is performed by using a suitable etching gas to define and produce the gate stack 108 that is vertically aligned with the patterned photoresist 109. In one embodiment, anisotropic dry gas plasma etching may be used, for example, by using elemental fluorine F, $CF_4$, $C_4F_8$, $CHF_3$, $CH_2F_2$, or $C_5F_8$ for etching without limitation. Other suitable etching gas chemistries, however, may also be used. The type of etching gas used will depend on the material selected for the hard mask layer 108 and the underlying gate layer 108b and gate dielectric layer 108c, all of which preferably are susceptible to etching using the same etching gas so that a single etching chamber may be used. On the other hand, the patterned photoresist 109 is resistant to the etching gas. In some embodiments, after the etching step, the resulting gate stack 108 includes a patterned gate dielectric 108a', a gate electrode 108b' and a patterned hard mask 108c'. After the gate stack 108 is formed, the patterned photoresist 109 is then removed from the top surface of the patterned hard mask 108c'.

Figure 3:
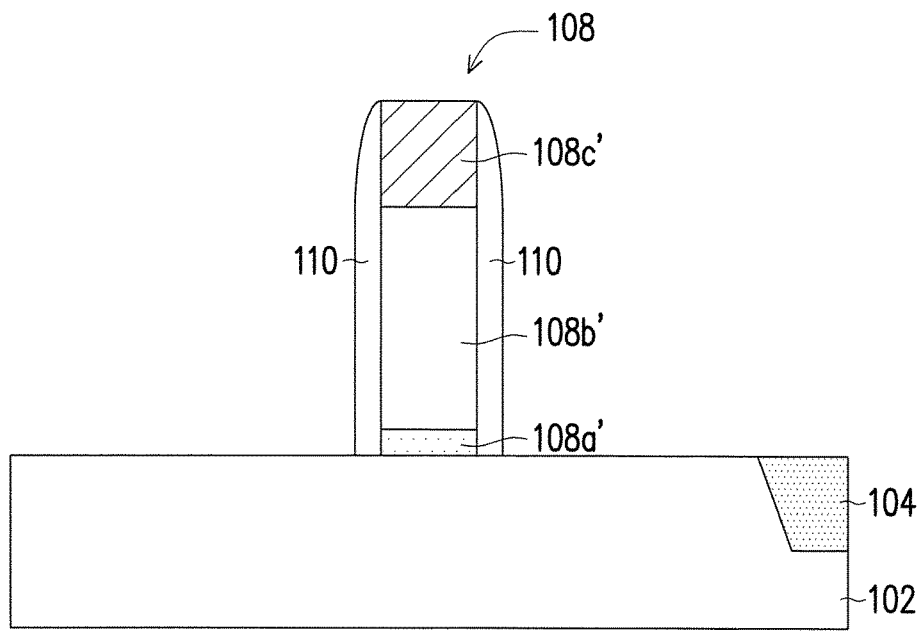

Subsequently, referring to FIG. 3, after the gate stack 108 is formed, a pair of spacers 110 are formed on two sidewalls of the gate stack 108. The pair of spacers 110 are formed on the substrate 110 and extend along the sidewalls of the patterned gate dielectric 108a', the gate electrode 108b' and the patterned hard mask 108c'. In some embodiments, the pair of spacers 110 are formed by depositing a layer of spacer material over the entire structure shown in FIG. 2, to cover the gate stack 108 and the substrate 102. The layer of spacer materials is then etched thereafter using conventional etching process to form the pair of spacers 110 located on the sidewalls of the gate stack 108 as shown in FIG. 3. In some embodiments, the spacer material used to form the spacers 110 are, for example, dielectric materials such as silicon nitride (SiN), silicon carbide (SiC), silicon oxynitride (SiON), SiCN, BN, $SiO_2$, and SiOCN. The pair of spacers 110 may include a single layer or multilayer structure. In some embodiments, the spacers 110 may have a multilayer structure which includes one or more liner layers (not shown). The liner layer includes a dielectric material such as silicon oxide, silicon nitride, and/or other suitable materials.

Figure 4:
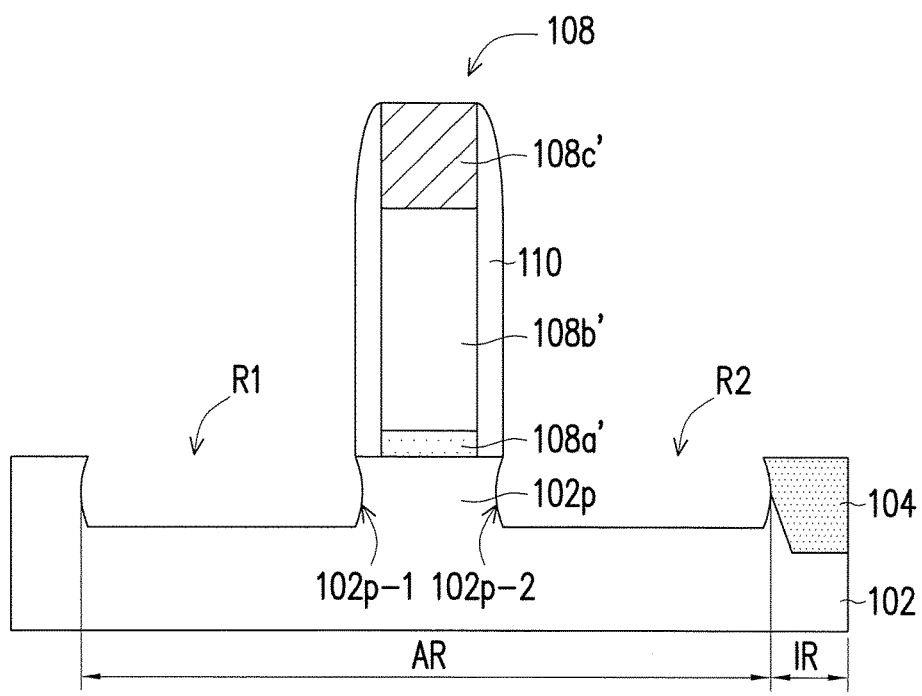

Referring to FIG. 4, after forming the pair of spacers 110, a plurality of recesses (R1/R2) are formed in the substrate 102 by removing portions of the substrate 102 uncovered by the gate stack 108 and the spacers 110. In some embodiments, an etching step is performed to form a first recess R1 and a second recess R2 in an active region AR of the substrate 102, adjacent to the isolation region IR of the substrate 102 where the trench isolation structure 104 is located. In one embodiment, the plurality of recesses (R1/R2) may be formed by a dry etch to first form a recess depth and then followed by a wet etch to from the desired profile. In certain embodiments, after the etching step, the plurality of recesses (R1/R2) defines a protruded portion 102p of the substrate 102 having a channel region (not shown). In some embodiments, the protruded portion 102p of the substrate may be defined as having a channel region and a semiconductor region as will be described in the subsequent steps. The protruded portion 102p has a first side surface 102p-1 and a second side surface 102p-2 opposite to the first side surface 102p-1. In some embodiments, the first side surface 102p-1 and the second side surface 102p-2 are slightly curved due to undercutting during formation of the recesses (first recess R1/second recess R2). Furthermore, referring to FIG. 4, in the exemplary embodiment, the gate strip 108 is disposed on the protruded portion 102p of the substrate 102 in the active region AR. Similarly, the pair of spacers 110 are also disposed on the protruded portion 102p of the substrate 102 in the active region AR.

Figure 5:
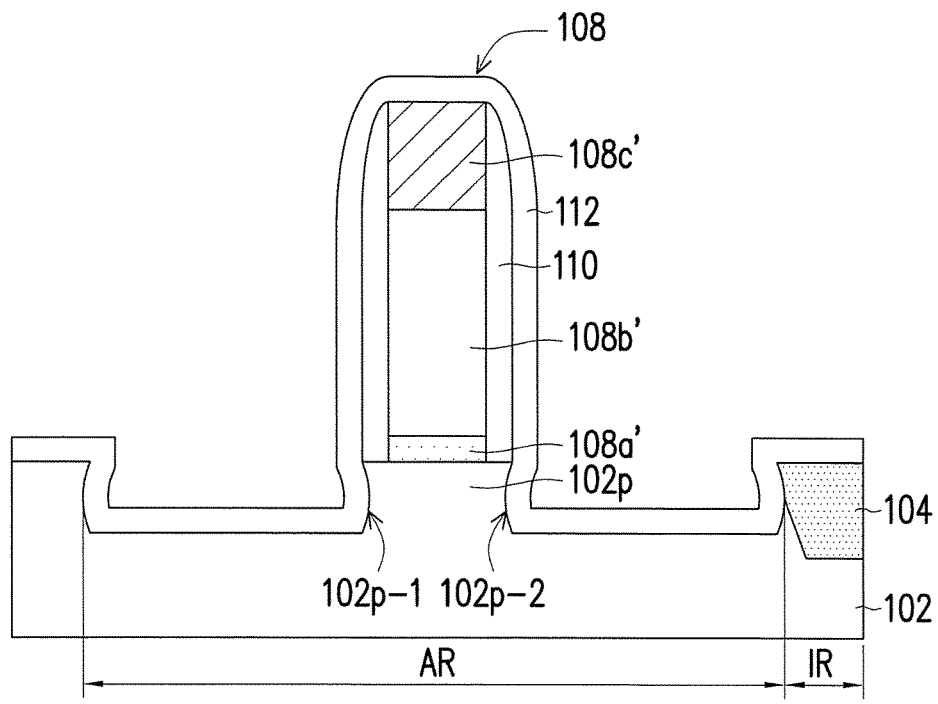

Referring to FIG. 5, after forming the plurality of recesses (R1/R2), an insulator layer 112 is formed on the entire structure shown in FIG. 4, so that the insulator layer 112 conformally covers the substrate 102, the first recess R1, the second recess R2, the gate stack 108, the spacers 110 and the trench isolation structure 104. In some embodiments, the insulator layer 112 may be formed by a suitable process such as atomic layer deposition (ALD), chemical vapor deposition (CVD), or the like. The insulator layer 112 may be any suitable thin film of insulating dielectric material commonly used in semiconductor fabrication processes for insulating layers. In exemplary embodiments, the insulator layer 112 may be formed of oxide layers, such as silicon dioxide.

Figure 6A:
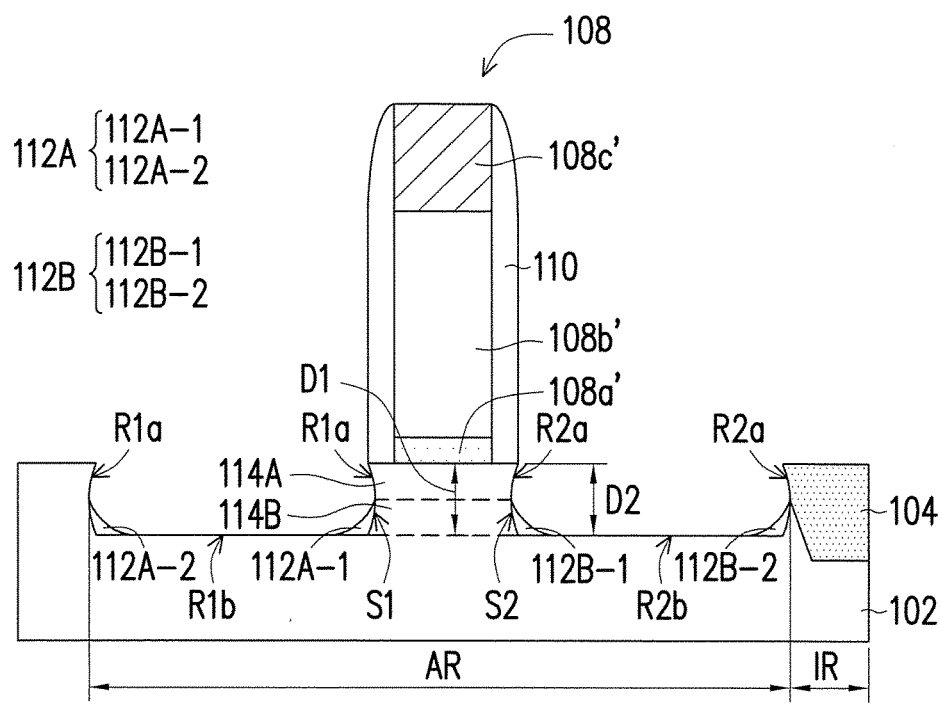
Figure 6B:
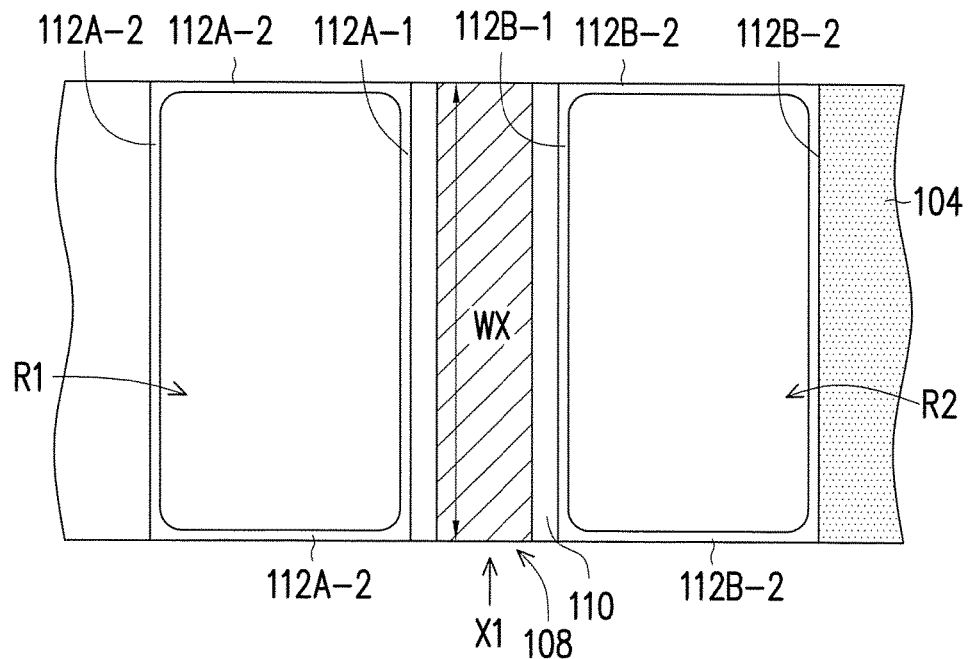
Figure 6C:
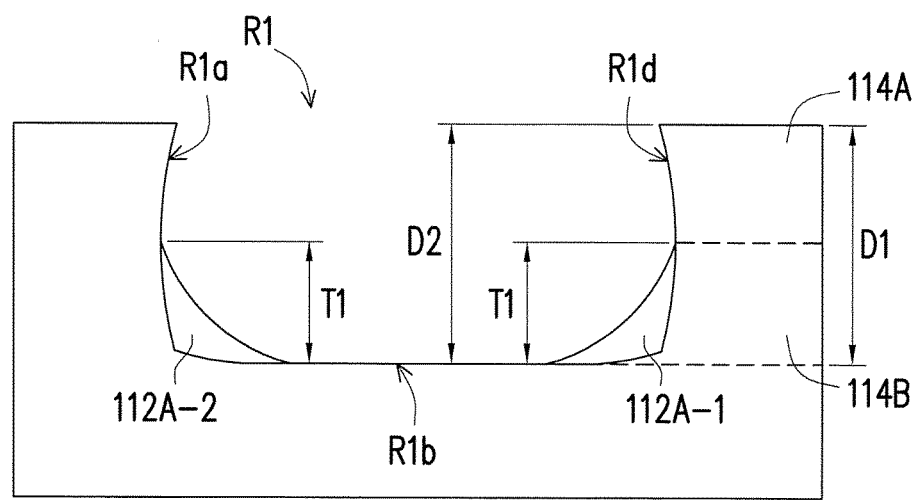

After forming the insulator layer 112, portions of the insulator layer 112 may be removed to form a pair of insulator structures (first insulator structure 112A and second insulator structure 112B) within the plurality of recesses (R1/R2) as shown in FIGS. 6A-6C. FIG. 6A is a cross-sectional view of the semiconductor structure after forming the pair of insulator structures (112A/112B). FIG. 6B is a top view of the semiconductor structure after forming the pair of insulator structures (112A/112B). FIG. 6C is an enlarged view of the first recess R1 shown in FIG. 6A. Referring to FIGS. 6A-6C, in some embodiments, portions of the insulator layer 112 are removed by isotropic etching to form the pair of insulator structures (112A/112B). By using isotropic etching, residual amounts of the insulator layer 112 may remain in the plurality of recesses (R1/R2) after etching, hence forming the first insulator structure 112A and the second insulator structure 112B as shown.

In the exemplary embodiment, a channel region 114A and a semiconductor region 114B may be defined after forming the pair of insulator structures (112A/112B), wherein the semiconductor region 114B is located below the channel region 114A. As shown in FIG. 6A, the pair of insulator structures (112A/112B) respectively cover parts of the first side surface 102p-1 and the second side surface 102p-2 (labeled in FIG. 5) of the protruded portion 102p, while the channel region 114A is uncovered by the pair of insulator structures (112A/112B). In certain embodiments, sidewalls (first sidewall S1 and second sidewall S2) of the semiconductor region 114B are covered by the pair of insulator structures (112A/112B). Furthermore, referring to FIG. 6B and FIG. 6C, the first insulator structure 112A is formed in the first recess R1, wherein the first insulator structure 112A extends from a bottom surface R1b to at least one sidewall R1a of the first recess R1, and the first insulator structure 112A covers a first sidewall S1 of the semiconductor region 114B. In a similar way, the second insulator structure 112B is formed in the second recess R2, wherein the second insulator structure 112B extends from a bottom surface R2b to at least one sidewall R2a of the first recess R2, and the second insulator structure 112B covers a second sidewall S2 of the semiconductor region 114B. The second sidewall S2 of the semiconductor region 114B is opposite to the first sidewall S1. In some other embodiments, the first insulator structure 112A and the second insulator structure 112B are disposed in the first recess R1 and the second recess R2, and not in contact with the pair of spacers 110.

In addition, as shown in FIG. 6A to FIG. 6C, a depth D2 of the plurality of recesses (R1/R2) is substantially equal to a height D1 of the protruded portion 102p of the substrate 102. In some embodiments, a height D1 of the protruded portion 102p and a depth D2 of the plurality of recesses (R1/R2) is in the range of 40 nm to 70 nm, but not particularly limited thereto. Furthermore, the first insulator structure 112A and the second insulator structure 112B each have a maximum thickness T1, wherein the thickest portion is defined as a portion of the insulator structures (112A/112B) that extends to the recess sidewalls (R1a/R2a). In some embodiments, the maximum thickness T1 of the insulator structures (112A/112B) may be in the range of 10 Å to 50 Å. In alternative embodiments, the maximum thickness T1 of the insulator structures (112A/112B) may vary due to the conditions of the isotropic etching. Moreover, in some embodiments, a boundary between the channel region 114A and the semiconductor region 114B is defined by a maximum thickness T1 of the pair of insulator structures (112A/112B). That is, the part of the protruded portion 102p covered by the thickest portion of the insulator structures (112A/112B) are defined as the semiconductor region 114B, while other parts of the protruded portion 102p uncovered by the thickest portion of the insulator structures (112A/112B) are defined as the channel region 114A. The interface or boundary between the channel region 114A and the semiconductor region 114B is, for example, aligned with a tip of the thickest portion (maximum thickness T1) of the insulator structures (112A/112B).

Furthermore, from a top view of the semiconductor structure shown in FIG. 6B, the pair of insulator structures (112A/112B) each comprises a leakage blocking portion (112A-1/112B-1) and a dummy portion (112A-2/112B-2). For example, the first insulator structure 112A includes a leakage blocking portion 112A-1 and a dummy portion 112A-2, wherein the leakage blocking portion 112A-1 is in contact with the semiconductor region 114B and the dummy portion 112A-2 is connected to the leakage blocking portion 112A-1 to form a ring-shaped structure. For instance, in some embodiments, the first insulator structure 112A extends along a peripheral of the bottom surface R1b of the first recess R1 to form the ring-shaped structure. Similarly, the second insulator structure 112B includes a leakage blocking portion 112B-1 and a dummy portion 112B-2, wherein the leakage blocking portion 112B-1 is in contact with the semiconductor region 114B and the dummy portion 112B-2 is connected to the leakage blocking portion 112B-1 to form a ring-shaped structure. For instance, in some embodiments, the second insulator structure 112B extends along a peripheral of the bottom surface R2b of the second recess R2 to form the ring-shaped structure. As may be noted from the top view in FIG. 6B, the residual amount of the insulator layer 112 remained after isotropic etching is mostly concentrated at the corners and sides at the bottom surfaces (R1b/R2b) of the first and second recesses R1 and R2, hence resulting in the ring-shaped structure.

In certain embodiments, the leakage blocking portion (112A-1 and 112B-1) of the first insulator structure 112A and the second insulator structure 112B extends along a channel width WX of the channel region 114A. In some other embodiments, the first insulator structure 112A and the second insulator structure 112B extends along an extension direction X1 of the gate stack 108. Since the leakage blocking portion (112A-1 and 112B-1) of the first insulator structure 112A and the second insulator structure 112B covers portion of the first side surface 102p-1 and the second side surface 102p-2 of the protruded portion 102p, it may act to block leakage current from the source and drain to the channel region 114, hence improving device performance.

After forming the pair of insulator structures (112A/112B), source/drain materials (first source/drain material 116A and second source/drain material 116B) are formed on the substrate 102 in the plurality of recesses (R1/R2) and on two opposing sides of the channel region 114A. In some embodiments, the source/drain materials (116A/116B) comprise silicon germanium (SiGe), silicon carbon (SiC) or silicon phosphide (SiP), for example. In some embodiments, the source/drain materials (116A/116B) are formed by selectively growing epitaxy. In one embodiment, the source/drain materials (116A/116B) are optionally formed with silicide top layers (not shown) by silicidation. Furthermore, in some embodiments, the source/drain materials (116A/116B) are doped with P-type or N-type impurities by dopant ion implantation to form NMOS or PMOS transistors, for example.

Figure 7:
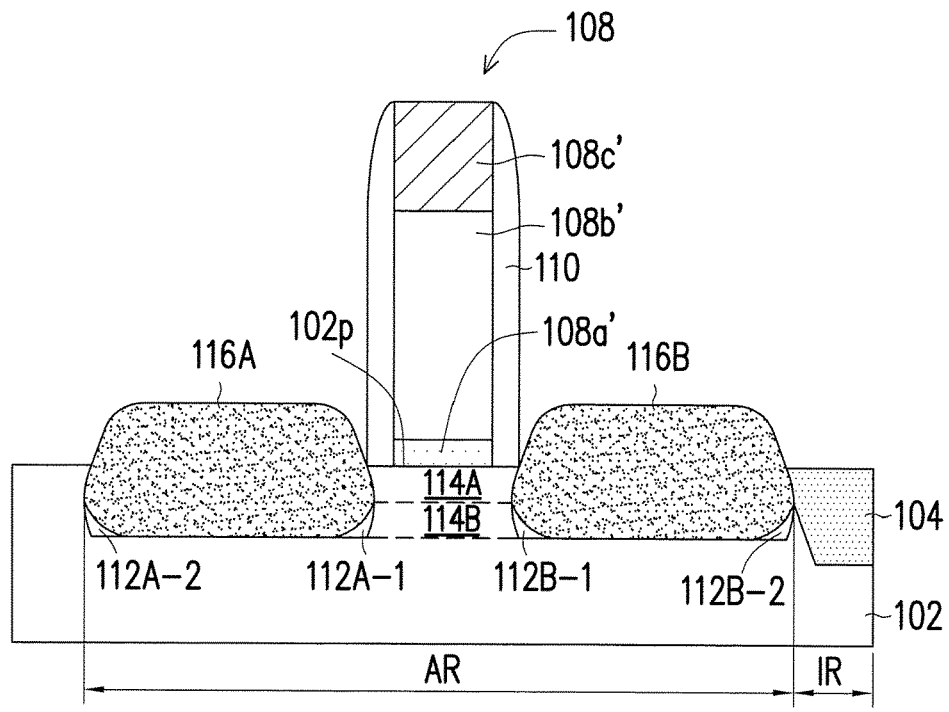

In addition, referring to FIG. 7, the first source/drain material 116A is disposed in the first recess R1, wherein the first insulator structure 112A (including 112A-1 and 112A-2) is located in between the first source/drain material 116A and the protruded portion 102p of the substrate 102. Similarly, the second source/drain material 116B is disposed in the second recess R2, wherein the second insulator structure 112B (including 112B-1 and 112B-2) is located in between the second source/drain material 116B and the protruded portion 102p of the substrate 102. In certain embodiments, the first source/drain material 116A and the semiconductor region 114B is spaced apart by the leakage blocking portion 112A-1 of the first insulator structure 112A. That is, the first source/drain material 116A is not in contact with the semiconductor region 114B. Furthermore, the second source/drain material 116B and the semiconductor region 114B is spaced apart by the leakage blocking portion 112B-1 of the second insulator structure 112B. That is, the second source/drain material 116B is not in contact with the semiconductor region 114B. In some embodiments, the channel region 114A is located in between the first source/drain material 116A and the second source/drain material 116B, and in contact with both of the first source/drain material 116A and the second source/drain material 116B. In some other embodiments, depending on the position of the transistor in the semiconductor device and the amount of insulator material remained after isotropic etching, the plurality of insulator structures (112A or 112B) may or may not be in contact with the trench isolation structure 104.

Figure 8:
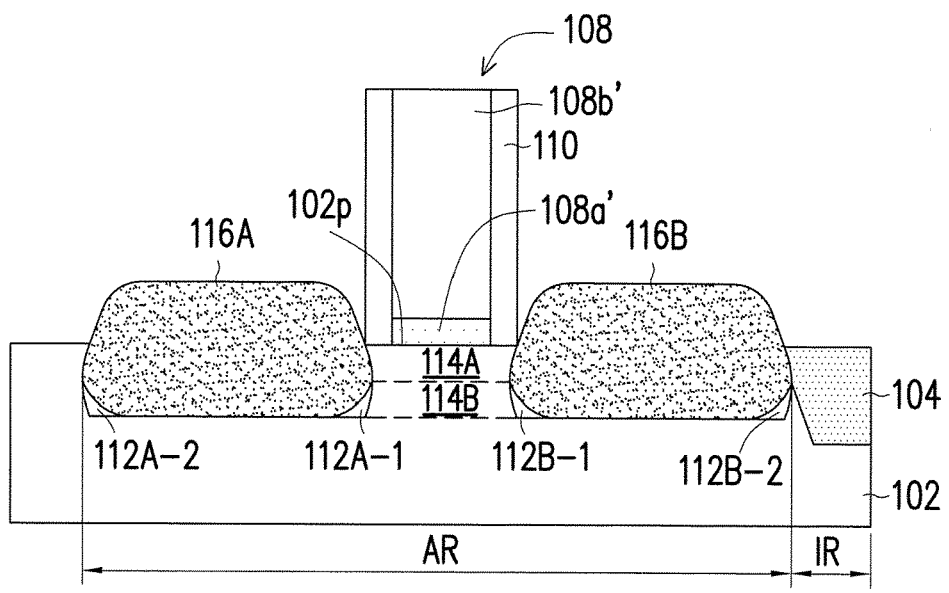

Subsequently, referring to FIG. 8, the patterned hard mask 108c' may be removed by any suitable convention means in the art to complete the formation of the gate stack 108 having the patterned gate dielectric 108a' and gate electrode 108b'. In some other embodiments, the gate electrode 108b' serves as a dummy gate electrode, whereby a metal gate (not shown) would replace the dummy gate electrode in subsequent steps. For example, a material of the metal gate may include TiN, WN, TaN, or Ru for a PMOS device, or Ti, Ag, Al, TiAl, TiAlN, TaC, TaCN, TaSiN, Mn, or Zr for an NMOS device. In some alternative embodiments, the gate electrode 108b' may further include a barrier, a work function layer, or a combination thereof. The gate electrode 108b', for example, may be removed through an etching process or other suitable processes. On the other hand, the metal gate (or replacement gate) may be formed by depositing a metal material (not shown) through suitable processes such as ALD, CVD, PVD, plating, or a combination thereof.

According to the embodiments of the disclosure, a plurality of insulator structures is disposed within the plurality of recesses and respectively covering parts of the first side surface and the second side surface of the protruded portion. As such, the protruded portion of the substrate may be defined as having a channel region and a semiconductor region. In the presence of the insulator structures located below the source/drain materials and at the corners of the source/drain materials, it may act to block leakage current from the source and drain to the channel region. Overall, the problem of leakage current may be resolved, and a performance of the device can be improved.

In one embodiment of the present disclosure, a semiconductor device including a substrate, a gate stack, a pair of insulator structures, and source/drain materials is provided. The substrate has a plurality of recesses, wherein the plurality of recesses defines a protruded portion of the substrate having a channel region, and the protruded portion has a first side surface and a second side surface opposite to the first side surface. The gate stack is disposed on the protruded portion of the substrate. The pair of insulator structures are disposed within the plurality of recesses and respectively covering parts of the first side surface and the second side surface of the protruded portion, wherein the channel region is uncovered by the pair of insulator structures. The source/drain materials are disposed on the substrate in the plurality of recesses and on two opposing sides of the channel region, wherein the source/drain materials cover the pair of insulator structures.

In another embodiment of the present disclosure, a semiconductor device including a substrate, a gate stack, a first insulator structure, a second insulator structure, a first source/drain material and a second source/drain material is provided. The substrate has active regions and isolation regions, wherein the substrate has a first recess and a second recess in the active regions that defines a protruded portion of the substrate, and the protruded portion has a channel region and a semiconductor region. The gate stack is disposed on the protruded portion of the substrate in the active regions. The first insulator structure is disposed in the first recess, extending from a bottom surface to one sidewall of the first recess, wherein the first insulator structure covers a first sidewall of the semiconductor region. The second insulator structure is disposed in the second recess, extending from a bottom surface to one sidewall of the second recess, wherein the second insulator structure covers a second sidewall of the semiconductor region, and the second sidewall is opposite to the first sidewall. The first source/drain material is disposed in the first recess, wherein the first insulator structure is located in between the first source/drain material and the protruded portion of the substrate. The second source/drain material is disposed in the second recess, wherein the second insulator structure is located in between the second source/drain material and the protruded portion of the substrate.

In yet another embodiment of the present disclosure, a method of fabricating a semiconductor device is described. The method includes the following steps. A substrate is provided. A gate stack is formed on the substrate. Portions of the substrate uncovered by the gate stack is removed to form a plurality of recesses in the substrate, wherein the plurality of recesses defines a protruded portion of the substrate having a channel region, and the protruded portion has a first side surface and a second side surface opposite to the first side surface. An insulator layer is formed conformally covering the plurality of recesses and the gate stack. Portions of the insulator layer is removed to form a pair of insulator structures within the plurality of recesses, wherein the pair of insulator structures respectively cover parts of the first side surface and the second side surface of the protruded portion, and the channel region is uncovered by the pair of insulator structures. Source/drain materials are formed on the substrate in the plurality of recesses and on two opposing sides of the channel region, wherein the source/drain materials are formed to cover the pair of insulator structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate having a plurality of recesses, wherein the plurality of recesses defines a protruded portion of the substrate having a channel region, and the protruded portion has a first side surface and a second side surface opposite to the first side surface;
    a gate stack disposed on the protruded portion of the substrate;
    a pair of insulator structures disposed within the plurality of recesses and respectively covering parts of the first side surface and the second side surface of the protruded portion, wherein the channel region is uncovered by the pair of insulator structures; and
    source/drain materials disposed on the substrate in the plurality of recesses and on two opposing sides of the channel region, wherein the source/drain materials cover the pair of insulator structures.

2. The semiconductor device according to claim 1, wherein the protruded portion further comprises a semiconductor region located below the channel region, and sidewalls of the semiconductor region are covered by the pair of insulator structures.

3. The semiconductor device according to claim 2, wherein a boundary between the channel region and the semiconductor region is defined by a maximum thickness of the pair of insulator structures.

4. The semiconductor device according to claim 2, wherein the pair of insulator structures each comprises a leakage blocking portion and a dummy portion, the leakage blocking portion is in contact with the semiconductor region, and the dummy portion is connected to the leakage blocking portion to form a ring-shaped structure.

5. The semiconductor device according to claim 2, wherein the source/drain materials are in contact with the channel region, and the source/drain materials and the semiconductor region are spaced apart by the pair of insulator structures.

6. The semiconductor device according to claim 1, wherein the pair of insulator structures extend along a channel width of the channel region.

7. The semiconductor device according to claim 1, further comprising spacers disposed on the protruded portion of the substrate and on two sidewalls of the gate stack, wherein the pair of insulator structures are not in contact with the spacers.

8. A semiconductor device, comprising:
    a substrate having active regions and isolation regions, wherein the substrate has a first recess and a second recess in the active regions that defines a protruded portion of the substrate, and the protruded portion has a channel region and a semiconductor region;
    a gate stack disposed on the protruded portion of the substrate in the active regions;
    a first insulator structure disposed in the first recess, extending from a bottom surface to one sidewall of the first recess, wherein the first insulator structure covers a first sidewall of the semiconductor region;
    a second insulator structure disposed in the second recess, extending from a bottom surface to one sidewall of the second recess, wherein the second insulator structure covers a second sidewall of the semiconductor region, and the second sidewall is opposite to the first sidewall;

a first source/drain material disposed in the first recess, wherein the first insulator structure is located in between the first source/drain material and the protruded portion of the substrate; and a second source/drain material disposed in the second recess, wherein the second insulator structure is located in between the second source/drain material and the protruded portion of the substrate.

9. The semiconductor device according to claim 8, wherein the semiconductor region is located below the channel region, and the channel region is uncovered by the first insulator structure and the second insulator structure.

10. The semiconductor device according to claim 8, wherein a boundary between the channel region and the semiconductor region is defined by a maximum thickness of the first insulator and the second insulator.

11. The semiconductor according to claim 8, wherein the first insulator structure extends along a peripheral of the bottom surface of the first recess to form a ring-shaped structure, and the second insulator structure extends along a peripheral of the bottom surface of the second recess to form a ring-shaped structure.

12. The semiconductor according to claim 11, wherein the first insulator structure and the second insulator structure each comprises a leakage blocking portion and a dummy portion, the leakage blocking portion is in contact with the semiconductor region and the dummy portion is connected to the leakage blocking portion to form the ring-shaped structure.

13. The semiconductor according to claim 12, wherein the leakage blocking portion of the first insulator structure and the second insulator structure extends along an extension direction of the gate stack.

14. The semiconductor according to claim 8, wherein the first source/drain material and the second source/drain material are in contact with the channel region, and the first source/drain material and the semiconductor region are spaced apart by the first insulator structure, the second source/drain material and the semiconductor region are spaced apart by the second insulator structure.

15. The semiconductor according to claim 8, further comprising spacers disposed on the protruded portion of the substrate and on two sidewalls of the gate stack, wherein the first insulator structure and the second insulator structure are not in contact with the spacers.

16. A method of fabricating a semiconductor device, comprising:

providing a substrate;

forming a gate stack on the substrate;

forming a plurality of recesses in the substrate by removing portions of the substrate uncovered by the gate stack, wherein the plurality of recesses defines a protruded portion of the substrate having a channel region, and the protruded portion has a first side surface and a second side surface opposite to the first side surface;

forming an insulator layer conformally covering the plurality of recesses and the gate stack;

removing portions of the insulator layer to form a pair of insulator structures within the plurality of recesses, wherein the pair of insulator structures respectively cover parts of the first side surface and the second side surface of the protruded portion, and the channel region is uncovered by the pair of insulator structures; and forming source/drain materials on the substrate in the plurality of recesses and on two opposing sides of the channel region, wherein the source/drain materials are formed to cover the pair of insulator structures.

17. The method of fabricating the semiconductor device according to claim 16, wherein the portions of the insulator layer are removed by isotropic etching to form the pair of insulator structures.

18. The method of fabricating the semiconductor device according to claim 17, wherein the pair of insulator structures each comprises a leakage blocking portion and a dummy portion, and the dummy portion is connected to the leakage blocking portion to form a ring-shaped structure.

19. The method of fabricating the semiconductor device according to claim 17, wherein the leakage blocking is formed to extend along a channel width of the channel region.

20. The method of fabricating the semiconductor device according to claim 16, wherein the insulator layer is formed by chemical vapor deposition or atomic layer deposition.

* * * * *